(12) United States Patent
Yu et al.

(10) Patent No.: US 11,270,869 B2
(45) Date of Patent: Mar. 8, 2022

(54) PLASMA CHEMICAL VAPOR DEPOSITION REACTOR WITH A MICROWAVE RESONANT CAVITY

(71) Applicant: TAIYUAN UNIVERSITY OF TECHNOLOGY, Shanxi (CN)

(72) Inventors: Shengwang Yu, Shanxi (CN); Ke Zheng, Shanxi (CN); Jie Gao, Shanxi (CN); Mingjie Lu, Shanxi (CN); Hongkong Wang, Shanxi (CN); Liangliang Li, Shanxi (CN); Mina Ren, Shanxi (CN)

(73) Assignee: TAIYUAN UNIVERSITY OF TECHNOLOGY, Shanxi (CN)

( * ) Notice: Subject to any disclaimer, the term of this patent is extended or adjusted under 35 U.S.C. 154(b) by 104 days.

(21) Appl. No.: 16/494,768

(22) PCT Filed: Feb. 5, 2018

(86) PCT No.: PCT/CN2018/075293
§ 371 (c)(1),
(2) Date: Sep. 17, 2019

(87) PCT Pub. No.: WO2018/188406
PCT Pub. Date: Oct. 18, 2018

(65) Prior Publication Data
US 2020/0105504 A1    Apr. 2, 2020

(30) Foreign Application Priority Data
Apr. 14, 2017   (CN) .......................... 201710244250.3

(51) Int. Cl.
*H01J 37/32* (2006.01)
*C23C 16/511* (2006.01)
(Continued)

(52) U.S. Cl.
CPC .... *H01J 37/32256* (2013.01); *C23C 16/4583* (2013.01); *C23C 16/511* (2013.01);
(Continued)

(58) Field of Classification Search
USPC ............................. 118/723 MW; 156/345.41
See application file for complete search history.

(56) References Cited

U.S. PATENT DOCUMENTS 5,418,430 A * 5/1995 Bayliss ............. H01J 37/32009
                                                    313/231.31
6,132,550 A * 10/2000 Shiomi ................. C23C 16/505
                                                    156/345.41
(Continued)

*Primary Examiner* — Rakesh K Dhingra

(57) ABSTRACT

This invention relates to a plasma chemical vapor deposition microwave resonant cavity, which has a high focusing ability and can be flexibly configured. The resonant cavity is a rotary body formed by two isosceles triangles intersecting at the vertex angles with a Boolean union operation. The base angles of the two triangles are 50°~75°. Between $2n\lambda \sim (2n+0.5)\lambda$, the base lengths of the two triangles are equal or have an $n\lambda$ difference, where n is an integer and $\lambda$ is the microwave wavelength. The distance between the centroids of the upper and the lower isosceles triangles is $0 \sim 4/5\lambda$. A strongly focused electric field can be formed in the cavity by adjusting the base lengths, base angles and centroid distance. Different dielectric windows, microwave coupling modes and gas inlet and outlet modes can be selected in the cavity to fit specific applications. The cavity has simple structures.

5 Claims, 7 Drawing Sheets

(51) Int. Cl.
    *C23C 16/458* (2006.01)
    *C23C 16/27* (2006.01)
(52) U.S. Cl.
    CPC .... *H01J 37/3222* (2013.01); *H01J 37/32238* (2013.01); *H01J 2237/3321* (2013.01)

(56) References Cited

U.S. PATENT DOCUMENTS

| | | | | |
|---|---|---|---|---|
| 6,622,650 | B2* | 9/2003 | Ishii | H01J 37/32192 |
| | | | | 118/723 AN |
| 6,863,773 | B1* | 3/2005 | Emmerich | H01J 37/3222 |
| | | | | 118/723 MW |
| 2004/0134431 | A1* | 7/2004 | Sohn | H01J 37/32192 |
| | | | | 118/723 MW |
| 2013/0125817 | A1* | 5/2013 | van Stralen | C03B 37/0183 |
| | | | | 118/723 ME |
| 2014/0230729 | A1* | 8/2014 | Brandon | H01J 37/32192 |
| | | | | 118/723 MW |
| 2017/0032986 | A1* | 2/2017 | Engelhardt | H01L 21/67115 |

* cited by examiner

PLASMA CHEMICAL VAPOR DEPOSITION REACTOR WITH A MICROWAVE RESONANT CAVITY

CROSS REFERENCE OF RELATED APPLICATION

This is a U.S. National Stage under 35 U.S.C 371 of the International Application PCT/CN2018/075293, filed Feb. 5, 2018, which claims priority under 35 U.S.C. 119(a-d) to CN 201710244250.3, filed Apr. 14, 2017.

BACKGROUND OF THE PRESENT INVENTION

Field of Invention

The present invention relates to the field of chemical vapor deposition technology. In particular, a microwave resonant cavity and a corresponding reactor relate to the field of plasma chemical vapor deposition technology

Description of Related Arts

Using microwave energy to generate plasma, materials such as diamond and graphene can be fulfilled by microwave plasma chemical vapor deposition (CVD) method. Since the plasma is generated in an electrodeless discharge process, it is relatively pure. When materials are prepared by hot filament CVD method or direct current arc plasma jet CVD method, they are often contaminated by the evaporation of the hot metal filament or the tungsten electrode. Compared with the radiofrequency CVD method, the microwave plasma CVD method has a relatively concentrated discharge region, a higher energy density, and a faster deposition rate. Therefore, this method has received extensive attention and has been widely used in the fields of research and preparation of high-quality diamond materials.

The resonant cavity is the main component of the microwave plasma CVD reactor. However, two tricky problems still remain. On one hand, the cavity structure of the microwave plasma CVD reactor often has a low focusing ability. Therefore, improving the focusing ability to form a strongly focused electric field and generate high-density plasma is preferred to develop new resonant cavity structures. On the other hand, the resonant cavity is less flexible. It should be combined with a specific coupling mechanism and a dielectric window in a microwave plasma CVD reactor. For example, an ellipsoidal resonant cavity needs to be equipped with a coaxial probe antenna as a coupling mechanism and a quartz bell jar as a dielectric window; a cylindrical resonant cavity is generally equipped with a coaxial probe antenna as a coupling mechanism and a quartz plate as a dielectric window; a butterfly resonant cavity needs to be equipped with a coaxial circumferential antenna as a coupling mechanism and a quartz ring as a dielectric window.

In order to overcome the two problems mentioned above, the present invention proposes a novel resonant cavity by utilizing the principle of reflection and interference of electromagnetic waves. The novel resonant cavity has a strong electric field focusing ability and can match different coupling mechanisms and dielectric windows to build microwave plasma CVD reactors.

SUMMARY OF THE PRESENT INVENTION

The present invention provides a plasma chemical vapor deposition reactor with a microwave resonant cavity for the purposes of improving the focusing ability and configuration flexibility.

Based on the above purposes, a rotary body is adopted for the microwave resonant cavity, which is formed by two isosceles triangles intersecting at the vertex angles with a Boolean union operation. Inside the rotary body, there are an upper cavity and a lower cavity. The base angles of the two triangles are $50°\sim75°$. Between $2n\lambda\sim(2n+0.5)\lambda$, the base lengths of the two triangles are equal or have an $n\lambda$ difference, where n is an integer, $\lambda$ is the microwave wavelength. The distance between the centroids of the upper and the lower isosceles triangles is $0\sim4/5\lambda$.

Further, an upper cylindrical cavity is provided in the middle part of the rotary body, and a lower cylindrical cavity is provided at the bottom of the lower cavity.

The plasma chemical vapor deposition reactor comprises a microwave coupling mechanism, a dielectric window, a substrate holder, a tuning mechanism, air inlet and outlet holes, and the microwave resonant cavity described above.

Further, in the plasma chemical vapor deposition reactor, the bases of the two isosceles triangles forming the microwave resonant cavity are equal in length. The top of the upper cavity is provided with a coaxial probe coupling antenna. A frequency tuning plate is set at the bottom of the lower cavity, and a microwave shielding elastic piece is placed between the frequency tuning plate and the lower cavity wall. The foot of the quartz bell jar dielectric window is placed on the frequency tuning plate and well-sealed. The top contour of the quartz bell jar dielectric window is higher than the interface of the upper and lower cavities. The substrate holder is set in the middle of the frequency tuning plate. An air inlet and two air outlets on both sides of the substrate holder are given in the frequency tuning plate.

Further, in the plasma chemical vapor deposition reactor, the base of the isosceles triangle forming the upper cavity is longer than that of the isosceles triangle forming the lower cavity. The upper cavity is provided with a coaxial circumferential coupling antenna on the top. The inner side of the top of the upper cavity is provided with a well-sealed quartz ring dielectric window which matches with the coaxial circumferential coupling antenna. In the center of the coaxial circumferential coupling antenna is an air inlet running through the microwave resonant cavity. At the bottom of the lower cavity, a frequency tuning plate is set. Between the frequency tuning plate and the lower cavity wall, a microwave shielding elastic piece is placed. The substrate holder is set in the middle of the frequency tuning plate. Two air outlets on both sides of the substrate holder are given in the frequency tuning plate, and a total air outlet is given at the bottom of the lower cavity.

Further, in the plasma chemical vapor deposition reactor, the base of the isosceles triangle forming the upper cavity is shorter than that of the isosceles triangle forming the lower cavity. The upper cavity is provided with a coaxial probe coupling antenna. A quartz plate dielectric window is horizontally set in the middle of the upper cavity and stuck onto the upper cavity wall. An air inlet is given at the upper cavity wall below the quartz plate dielectric window. A frequency tuning plate is set at the bottom of the lower cavity. Between the frequency tuning plate and the lower cavity wall, a microwave shielding elastic piece is placed. A substrate holder is set in the middle of the frequency tuning plate. On both sides of the substrate holder, two air outlets are given. Besides, a total air outlet at the bottom of the lower cavity is given.

Further, in a structure comprising an upper cylindrical cavity and a lower cylindrical cavity, the plasma chemical vapor deposition reactor is provided, which comprises a microwave coupling mechanism, a dielectric window, a substrate holder, a tuning mechanism, air inlet and outlet holes, and the microwave resonant cavity according to claim 2. The top of the upper cavity is provided with a coaxial circumferential coupling antenna. The inner side of the top of the upper cavity is provided with a well-sealed quartz ring dielectric window which matches with the coaxial circumferential coupling antenna. In the center of the antenna is an air inlet running through the microwave resonant cavity. A central first frequency tuning plate is set in the middle of the lower cylindrical cavity, and a substrate holder is set in the middle of the first frequency tuning plate. A second frequency tuning plate perpendicular to the first frequency tuning plate is set around the substrate holder. Two air outlets are given in the second frequency tuning plate on both sides of the substrate holder, and a total air outlet is given at the bottom of the cavity.

When microwaves are coupled into the microwave resonant cavity from the upper part of the reactor, it is hoped that a highly intensive and uniformly distributed focused electric field can be formed at the bottom center of the resonant cavity. Based on the principle of reflection and interference of electromagnetic waves, the strongly focused electric field in this invention is formed by adjusting the base lengths, the base angles and the centroid distance. According to specific applications, different dielectric windows, microwave coupling modes and reaction gas inlet and outlet modes can be selected in the resonant cavity. With simple structures, the resonant cavity is convenient and flexible.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

Figure 1:
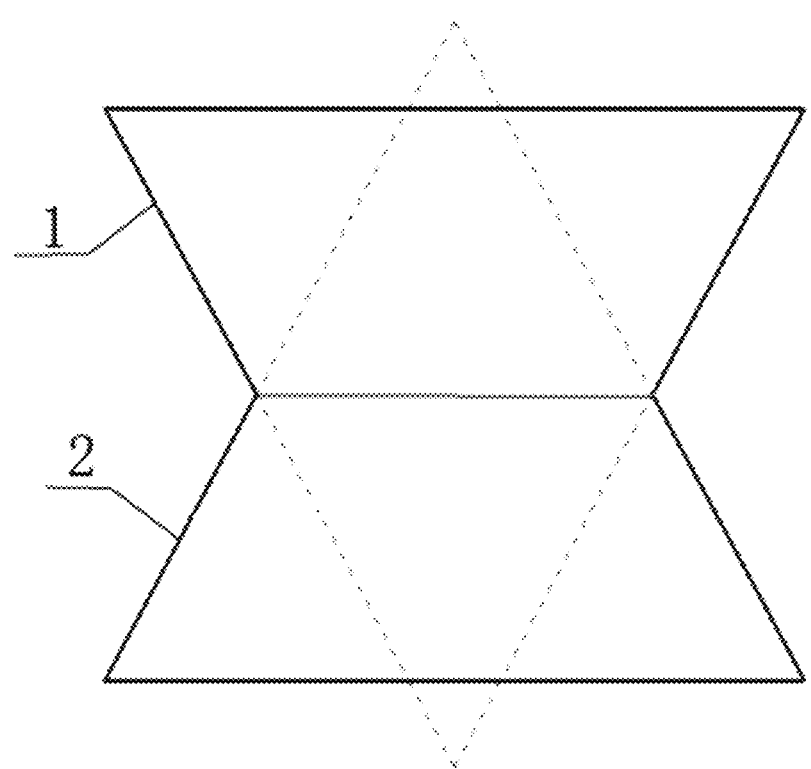
FIG. 1 is a schematic diagram of the microwave resonant cavity according to the embodiments of the present invention.

In the drawings, the following reference numbers are used: 1—Upper cavity; 2—Lower cavity; 3—Upper cylindrical cavity; 4—Lower cylindrical cavity; 5—Coaxial probe coupling antenna; 6—Frequency tuning plate; 7—Quartz bell jar dielectric window; 8—Substrate holder; 9—Air inlet; 10—Air outlet; 11—Coaxial circumferential coupling antenna; 12—Quartz ring dielectric window; 13—Quartz plate dielectric window; 14—Total outlet; 15—Lifting mechanism of substrate holder; 16—Lifting mechanism of frequency tuning plate; 61—First frequency tuning plate; 62—Second frequency tuning plate; 161—Lifting mechanism of first frequency tuning plate; 162—Lifting mechanism of second frequency tuning plate.

DETAILED DESCRIPTION OF THE PREFERRED EMBODIMENT

In a typical embodiment of the present invention, a plasma chemical vapor deposition microwave resonant cavity is a rotary body formed by two isosceles triangles intersecting at the vertex angles with a Boolean union operation, as shown in FIG. 1. The rotary body comprises an upper cavity (1) and a lower cavity (2). Between $2n\lambda \sim (2n+0.5)\lambda$, the base lengths of the two triangles are equal or have an $n\lambda$ difference, where n is an integer and $\lambda$ is the microwave wavelength. The base angles of the two triangles are $50°\sim75°$, and the centroid distance of the upper and the lower isosceles triangles is $0\sim4/5\lambda$.

Figure 2:
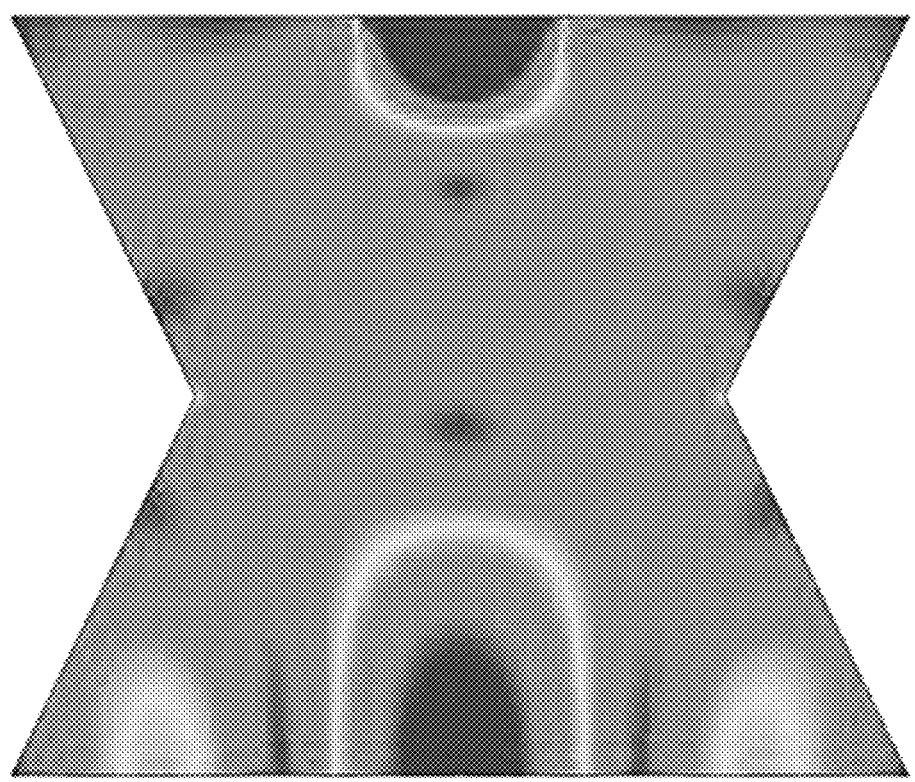
FIG. 2 presents simulated electric field contours of the microwave resonant cavity according to the embodiments of the present invention.

The simulated electric field contours of the microwave resonant cavity according to typical embodiments of the present invention are shown in FIG. 2. The microwaves are coupled in the upper cavity (1) and form an intensively focused electric field at the bottom center of the lower cavity (2).

In a preferred embodiment (see the following embodiment 4), the central part of the rotary body is an upper cylindrical cavity (3), and the bottom part of the lower cavity (2) is a lower cylindrical cavity (4).

A plasma chemical vapor deposition reactor can be constructed by combining the microwave resonant cavity mentioned above with a microwave coupling mechanism, a dielectric window (7), a substrate holder (8), a tuning mechanism, and air inlet hole (9) and outlet holes (10).

Figure 7:
FIG. 7 is the surface morphology of a diamond film deposited by an optimized device of the invention.
Figure 8:
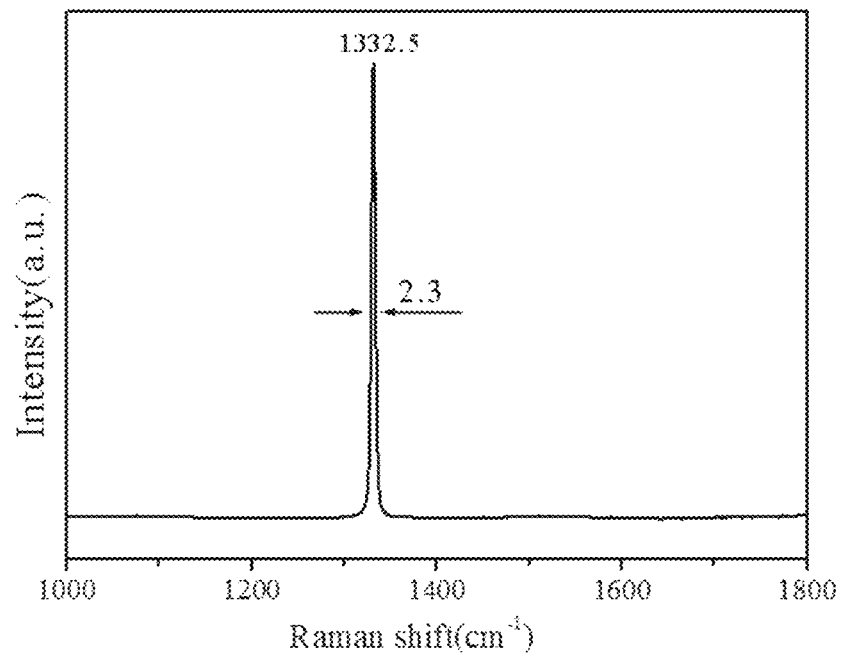
FIG. 8 is the Raman spectrum of the diamond film by the optimized device of the invention.

FIG. 7 shows the surface morphology of a diamond film prepared by plasma chemical vapor deposition reactor in accordance with the following embodiment 4. The crystal grains in the film surface are uniform and compact. There are no evident gaps between the diamond grain boundaries and defects of secondary nucleation particles. FIG. 8 is corresponding Raman shift of the diamond film. The Raman spectrum has only one peak corresponding to the diamond characteristic peak near 1332.5 $cm^{-1}$. Without the characteristic peaks of graphite and other impurities, can be observed. The full width at half maximum of the diamond characteristic peak is about 2.3 $cm^{-1}$. The above statements indicate that the prepared diamond film possesses high quality.

The structure and technical effects of the plasma chemical vapor deposition reactor with a microwave resonant cavity according to the present invention will be further described through the following specific embodiments.

It should be noted that there are two common industrial microwave frequencies in the technical field, namely 2.45 GHz and 915 MHz. Corresponding to the two microwave frequencies, the wavelengths are $\lambda_1=122.4$ mm and $\lambda_2=327.9$ mm, respectively. In the specific embodiments, the microwave wavelength $\lambda=122.4$ mm (the wavelength allowable deviation is ±10 mm) is adopted. For the microwave resonant cavity, the base lengths of the isosceles triangles are $2n\lambda$ $(2n+0.5)\lambda$, where n is 1 and $\lambda$ is 122.4 mm, that is, the base lengths are 244.8~306 mm. The base lengths of the two isosceles triangles are equal or have a difference of $\lambda$, that is, the base lengths of the two isosceles triangles are equal or have a difference of 122.4 mm (the allowable deviation is ±10 mm). The centroid distance of the upper and the lower isosceles triangles is 0~4/5λ, that is, 0~97.92 mm.

Embodiment 1

Figure 3:
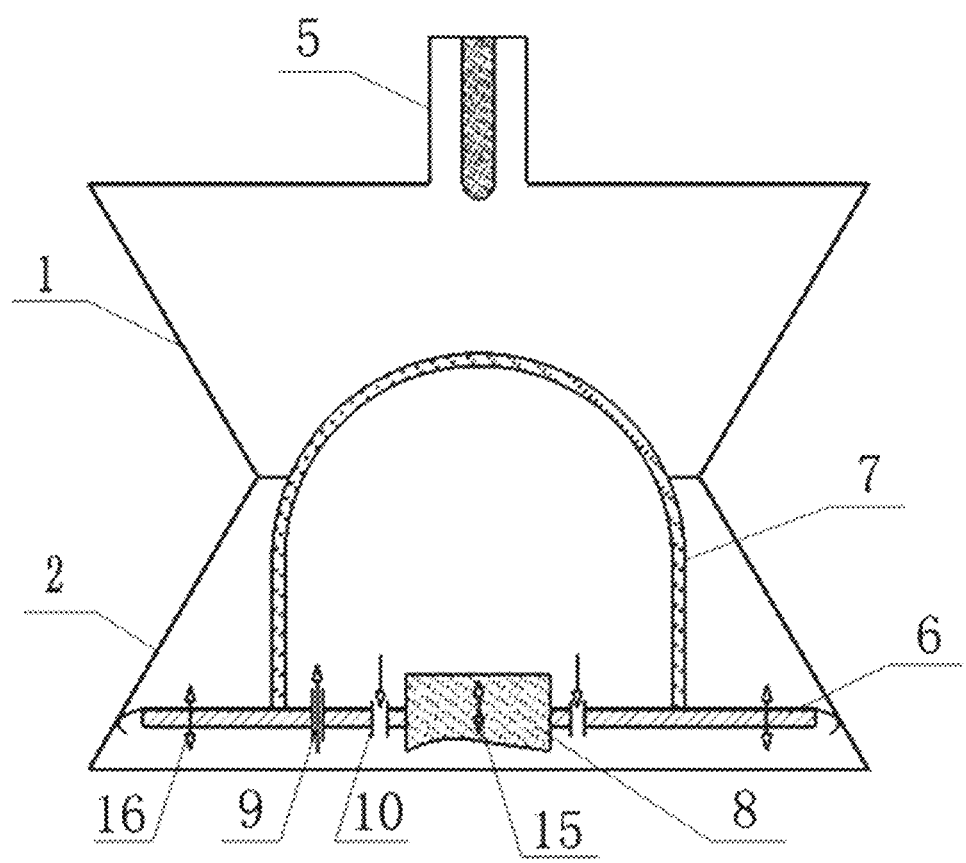
FIG. 3 is a schematic diagram of the plasma chemical vapor deposition reactor in accordance with embodiment 1 of the present invention.

This embodiment refers to FIG. 3. The base lengths of the two isosceles triangles forming the microwave resonant cavity are equal. The top of the upper cavity (1) is provided with a coaxial probe coupling antenna (5). The bottom of the lower cavity (2) is provided with a frequency tuning plate (6). Between the frequency tuning plate (6) and the lower cavity wall, a microwave shielding elastic piece is placed. The foot of the quartz bell jar dielectric window (7) is placed on the frequency tuning plate (6) without a gap. The top contour of the quartz bell jar dielectric window (7) is higher than the interface of the upper cavity (1) and lower cavity (2). A substrate holder (8) is set in the middle of the frequency tuning plate (6). An air inlet (9) and two air outlets (10) on both sides of the substrate holder (8) are given in the frequency tuning plate (6). Further, the substrate holder (8) and the frequency tuning plate (6) are equipped with lifting mechanisms (15) and (16) respectively.

In the specific implementation, the base lengths of the two isosceles triangles are equal, which are 245±5 mm; the centroid of the upper isosceles triangle coincides with that of the lower isosceles triangle, that is, the centroid distance of the two triangles is 0; the base angles of the two isosceles triangles are both 50°.

Embodiment 2

Figure 4:
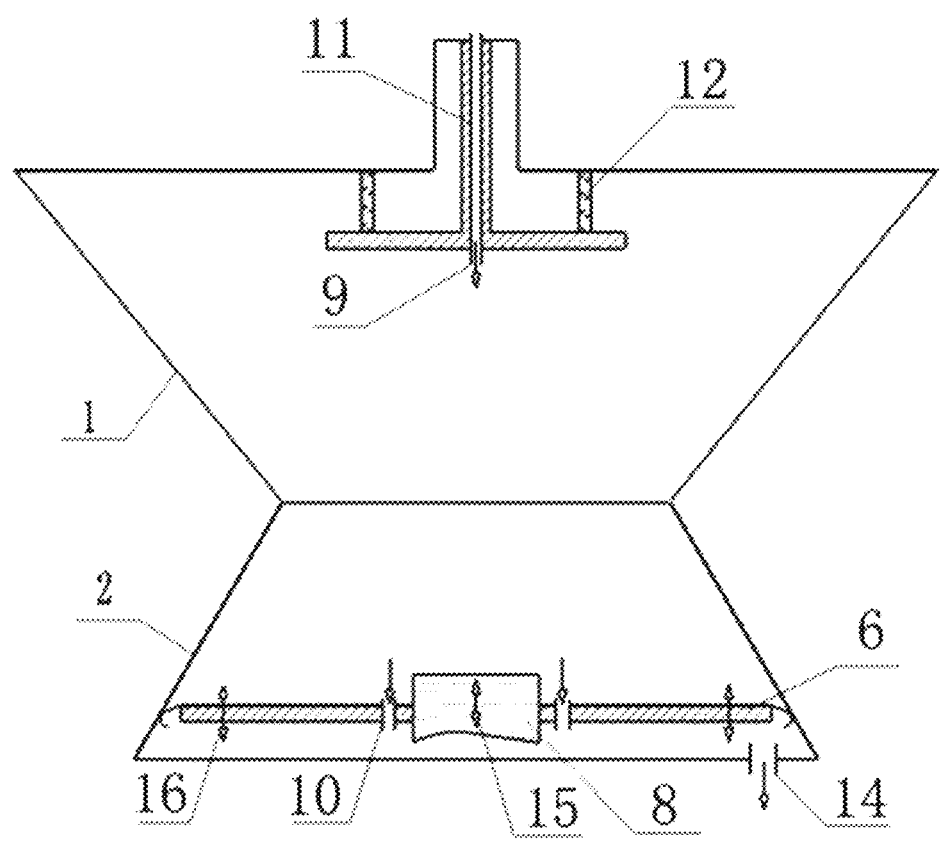
FIG. 4 is a schematic diagram of the plasma chemical vapor deposition reactor in accordance with embodiment 2 of the present invention.

This embodiment refers to FIG. 4. The base of the isosceles triangle forming the upper cavity (1) is longer than that of the isosceles triangle forming the lower cavity (2). The top of the upper cavity (1) is provided with a coaxial circumferential coupling antenna (11). The inner side of the top of the upper cavity (1) is provided with a well-sealed quartz ring dielectric window (12) which matches with the coaxial circumferential coupling antenna (11). In the center of the coaxial circumferential coupling antenna (11) is the air inlet (9) running through the microwave resonant cavity. At the bottom of the lower cavity (2), a frequency tuning plate (6) is set. Between the frequency tuning plate (6) and the lower cavity wall, a microwave shielding elastic piece is placed. The substrate holder (8) is set in the middle of the frequency tuning plate (6). Two air outlets (10) on both sides of the substrate holder (8) are given in the frequency tuning plate (6), and a total air outlet (14) is given at the bottom of the lower cavity. Further, the substrate holder (8) and the frequency tuning plate (6) are equipped with lifting mechanisms (15) and (16), respectively.

In the specific implementation, the base length and the base angle of the upper isosceles triangle are 735±5 mm and 55° respectively; for the lower isosceles triangle, they are 490±5 mm and 60° respectively; the centroid distance of the two isosceles triangles is 55±5 mm.

Embodiment 3

Figure 5:
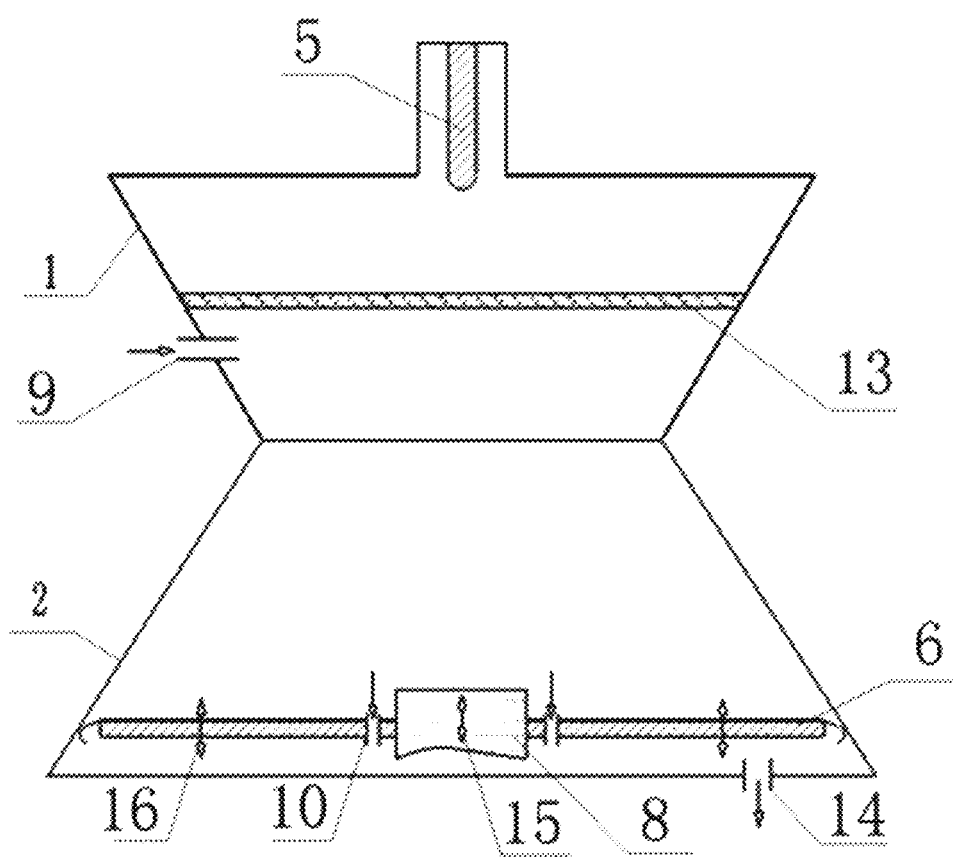
FIG. 5 is a schematic diagram of the plasma chemical vapor deposition reactor in accordance with embodiment 3 of the present invention.

This embodiment refers to FIG. 5. The base of the isosceles triangle forming the upper cavity (1) is shorter than that of the isosceles triangle forming the lower cavity (2). The upper cavity (1) is provided with a coaxial probe coupling antenna (5). A quartz plate dielectric window (13) is horizontally set in the middle of the upper cavity (1) and stuck onto the upper cavity wall. The air inlet (9) is given at the upper cavity wall below the quartz plate dielectric window (13). The frequency tuning plate (6) is set at the bottom of the lower cavity (2). Between the frequency tuning plate (6) and the lower cavity wall a microwave shielding elastic piece is placed. A substrate holder (8) is set in the middle of the frequency tuning plate (6). On both sides of the substrate holder (8), two air outlets (10) are given. Besides, the total air outlet (14) at the bottom of the lower cavity (2) is given. Further, the substrate holder (8) and the frequency tuning plate (6) are equipped with lifting mechanisms (15) and (16), respectively.

In the specific implementation, the base length and the base angle of the upper isosceles triangle are 790±5 mm and 75°, respectively; for the lower isosceles triangle, they are 1035±5 mm and 55°, respectively; the centroid distance of the two isosceles triangles is 95±5 mm.

Embodiment 4

Figure 6:
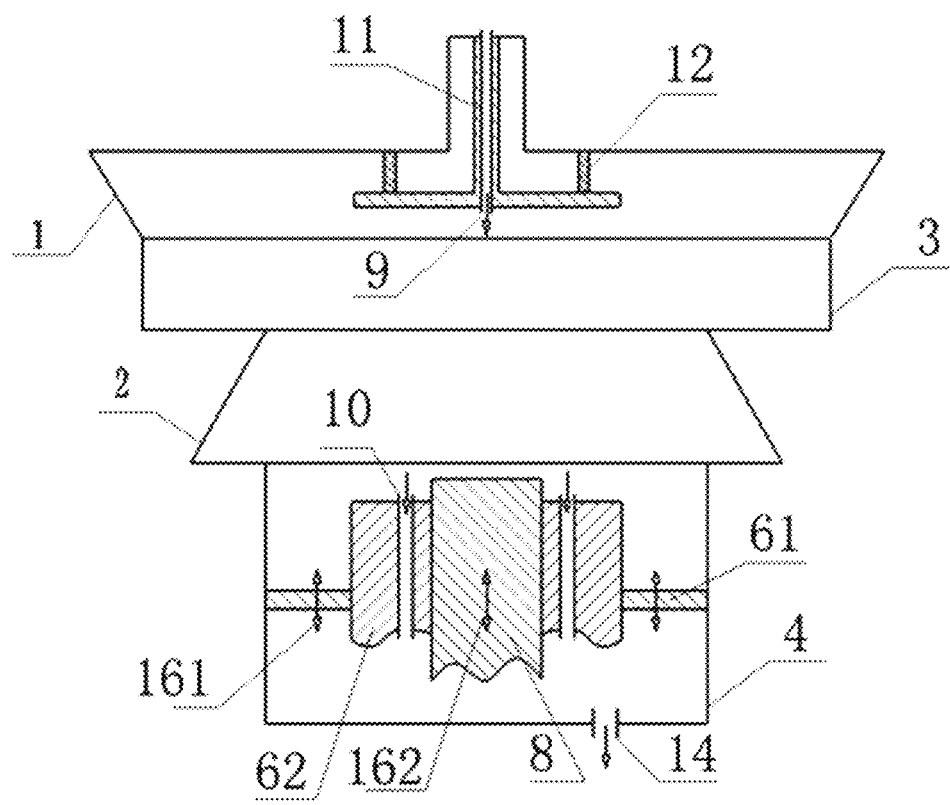
FIG. 6 is a schematic diagram of the plasma chemical vapor deposition reactor in accordance with embodiment 4 of the present invention.

This embodiment refers to FIG. 6. Different from other embodiments, the middle part of the rotary body is provided with an upper cylindrical cavity (3), and the bottom of the lower cavity (2) is provided with a lower cylindrical cavity (4). The base of the isosceles triangle forming the upper cavity (1) is longer than that of the isosceles triangle forming the lower cavity (2). The top of the upper cavity (1) is provided with the coaxial circumferential coupling antenna (11). The inner side of the top of the upper cavity (1) is provided with a well-sealed quartz ring dielectric window (12) which matches with the coaxial circumferential coupling antenna (11). In the center of the antenna is the air inlet (9) running through the microwave resonant cavity. The middle part of the lower cylinder cavity (4) is provided with a horizontal first frequency tuning plate (61), and the substrate holder (8) is set in the middle of the first frequency tuning plate (61). A second frequency tuning plate (62) perpendicular to the first frequency tuning plate (61) is set around the substrate holder (8). Two air outlets (10) on both sides of the substrate holder (8) are given in the second frequency tuning plate (62), and the total air outlet (14) is given at the bottom of the cavity (4). Further, the substrate holder (8), the first frequency tuning plate (6) and the second frequency tuning plate are equipped with lifting mechanisms (15), (161) and (162), respectively.

In the specific implementation, the base length and the base angle of the upper isosceles triangle are 1244±5 mm and 65° respectively; for the lower isosceles triangle, they are 1000±5 mm and 55° respectively; the diameter and the height of the upper cylindrical cavity (3) are 1110±5 mm and 290±5 mm respectively; for the lower cylindrical cavity (4), they are 850±5 mm and 165±5 mm respectively; the centroid distance of the two isosceles triangles is 35±5 mm.

What is claimed is:

1. A plasma chemical vapor deposition microwave resonant cavity, wherein the microwave resonant cavity comprises a rotary body formed by intersection and truncation of two oppositely disposed cones joined together at the truncation, and each of the cones is generated by rotation of an isosceles triangle about an axis of the isosceles triangle which passes through an apex of the isosceles triangle, the rotary body comprises an upper cavity and a lower cavity; a base of each of the isosceles triangles is 2nλ~(2n+0.5)λ, where n is an integer and λ is a microwave wavelength; a base angle of each of the isosceles triangles is 50°~75°; base lengths of the two isosceles triangles are equal or have an nλ difference; a distance between centroids of an upper and a lower isosceles triangles is 0~4/5λ.

2. A plasma chemical vapor deposition reactor, the reactor comprising: a. microwave coupling mechanism, a dielectric window, a substrate holder, a tuning mechanism, an air inlet hole and outlet holes, and a microwave resonant cavity; wherein the microwave coupling mechanism is a coaxial probe antenna or a coaxial circumferential antenna; the tuning mechanism is a frequency tuning plate; the microwave resonant cavity comprises a rotary body formed by intersection and truncation of two oppositely disposed cones joined together at the truncation, and each of the cones is generated by rotation of an isosceles triangle about an axis of the isosceles triangle which passes through an apex of the isosceles triangle, the rotary body comprises an upper cavity and a lower cavity; a base of each of the isosceles triangles is 245±5 mm; a base angle of each of the isosceles triangles is 50°; base lengths of the two isosceles triangles are equal; a distance between centroids of an upper and a lower isosceles triangles is $0\sim4/5\lambda$.

3. The plasma chemical vapor deposition reactor as recited in claim 2, wherein bases of two isosceles triangles forming the microwave resonant cavity are equal in length; a top of an upper cavity is provided with the coaxial probe coupling antenna; a bottom of a lower cavity is provided with a the frequency tuning plate; a foot of a quartz bell-jar dielectric window is placed on the frequency tuning plate; a top contour of the quartz bell-jar dielectric window is higher than an interface of the upper cavity and the lower cavity: a substrate holder is set in a middle of the frequency tuning plate, and an air inlet and two air outlets are given in the frequency tuning plate near the substrate holder.

4. The plasma chemical vapor deposition reactor, as recited in claim 2, wherein a first base of one of isosceles triangles forming an upper cavity is longer than a second base of one of isosceles triangles forming the lower cavity; a top of the upper cavity is provided with the coaxial circumferential coupling antenna; an inner side of the top of the upper cavity is provided with a quartz ring dielectric window adapted to the coaxial circumferential coupling antenna; in a center of the coaxial circumferential coupling antenna is an air inlet running through the microwave resonant cavity; a bottom of the lower cavity is provided with the frequency tuning plate; a substrate holder is set in a middle of frequency tuning, plate, and the frequency tuning plate is provided with two air outlets on both sides of the substrate holder.

5. The plasma chemical vapor deposition reactor, as recited in claim 2, wherein a base of one of isosceles triangles forming an upper cavity is shorter than a base of one of isosceles triangles forming a lower cavity; a top of the upper cavity is provided with the coaxial probe coupling antenna; a quartz plate dielectric window is horizontally set in a middle part of the upper cavity; an air inlet is given at the upper cavity wall below the quartz plate dielectric window; the frequency tuning, plate is set at a bottom of the lower cavity; a substrate holder is set in a middle of the frequency tuning plate; two air outlets on both sides of the substrate holder are given in the frequency tuning plate, and a total air outlet is given at the bottom of the lower cavity.

* * * * *